United States Patent [19]

Cook

[11] Patent Number: 5,262,683

[45] Date of Patent: Nov. 16, 1993

[54] METHOD FOR SPECIFYING OPERATING CHARACTERISTICS OF INTEGRATED CIRCUITS

[75] Inventor: Roger J. Cook, Livonia, Mich.

[73] Assignee: Ford Motor Company, Dearborn, Mich.

[21] Appl. No.: 871,161

[22] Filed: Apr. 20, 1992

[51] Int. Cl.$^5$ ............................................. H03K 5/12
[52] U.S. Cl. ..................................... 307/263; 307/303; 370/85.1; 371/20.1; 371/28
[58] Field of Search ............... 307/263, 268, 303, 350, 307/360, 475, 443; 370/85.1; 371/28, 20.1; 455/99, 3.1

[56] References Cited

U.S. PATENT DOCUMENTS

| | | | |
|---|---|---|---|
| 3,919,461 | 11/1975 | Hunting et al. | 178/2 R |
| 4,425,564 | 1/1984 | Steele | 340/825.79 |
| 4,429,384 | 1/1984 | Kaplinsky | 370/85 |
| 4,507,576 | 3/1985 | McCracken et al. | 307/475 |
| 4,534,025 | 8/1985 | Floyd | 370/85 |
| 4,569,046 | 2/1986 | Hadziomerovic et al. | 370/85 |
| 4,584,487 | 4/1986 | Hesse et al. | 307/10 |
| 4,596,936 | 6/1986 | Aoyama | 307/263 |
| 4,614,882 | 9/1986 | Parker et al. | 307/443 |
| 4,706,082 | 11/1987 | Miesterfeld et al. | 340/825.5 |
| 4,745,596 | 5/1988 | Sato | 370/85 |
| 4,792,950 | 12/1988 | Volk et al. | 371/8 |
| 4,797,582 | 1/1989 | Nguyen et al. | 307/475 |
| 4,809,266 | 2/1989 | Okada | 370/85 |
| 4,887,262 | 12/1989 | van Veldhuizen | 370/85.1 |
| 4,890,010 | 12/1989 | Neudeck et al. | 307/270 |
| 4,929,941 | 5/1990 | Lecocq | 340/825.14 |
| 4,937,816 | 6/1990 | van Steenbrugge et al. | 370/85.6 |
| 4,951,281 | 8/1990 | Muto et al. | 370/95.2 |

OTHER PUBLICATIONS

Kramer, Joel A., "Standard 3M recording techniques could spur low-cost $\mu C$ use", *EDN*, pp. 75-81, May 5, 1978.

Kaplinsky, Cecil H., "The D$^2$B a One Logical Wire Bus for Consumer Applications", *IEEE Transactions on Consumer Electronics*, vol. CE, pp. 102-106, Feb. 27, 1981.

Mitchell, Ronald L., "A Small Area Network for Cars", SAE Paper II 840317, pp. 1-8, Feb. 1984.

*Primary Examiner*—John Zazworsky
*Attorney, Agent, or Firm*—Roger L. May; Richard D. Dixon

[57] ABSTRACT

A method for specifying characteristics of an integrated circuit wherein complementary output signals of the integrated circuit are required to cross or equal one another within a signal transition box during transitions of the complementary output signals. The signal transition box is defined by a maximum output signal level as a high side, a minimum output signal level as a low side, a minimum delay time as a leading side and a maximum delay time as a trailing side. A maximum allowable slew rate preferably is also defined.

5 Claims, 1 Drawing Sheet

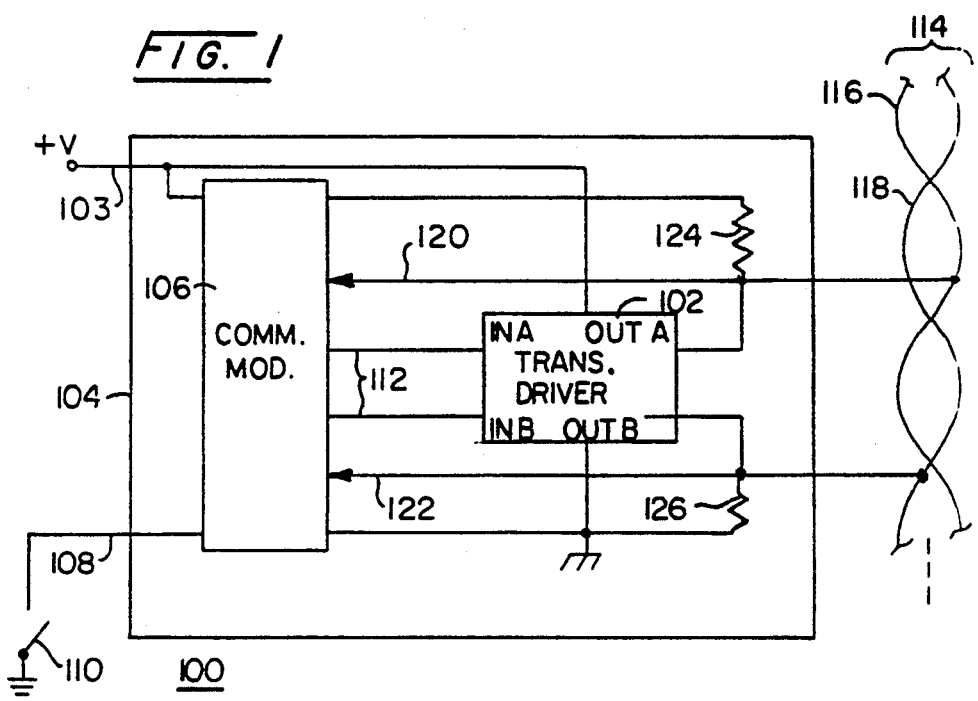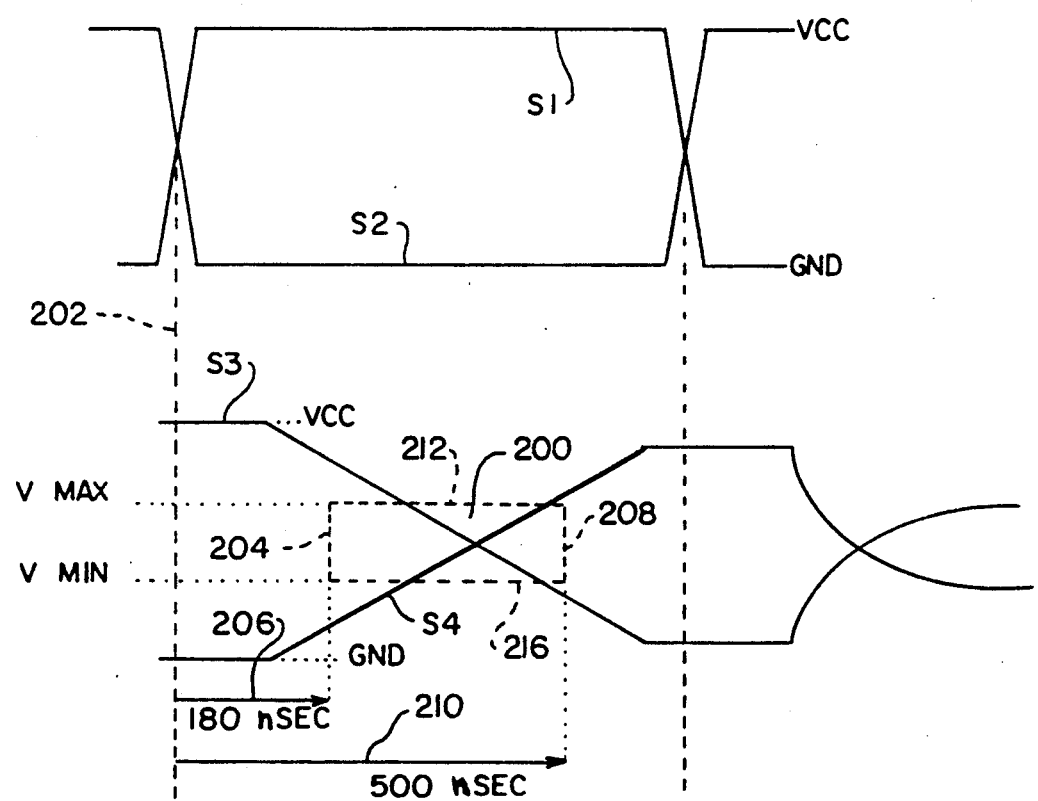

METHOD FOR SPECIFYING OPERATING CHARACTERISTICS OF INTEGRATED CIRCUITS

BACKGROUND OF THE INVENTION

The present invention relates generally to performance characteristics of integrated circuits and, more particularly, to a method for specifying performance characteristics of integrated circuits to facilitate manufacturing while still ensuring proper operation of the integrated circuits by defining acceptable boundary areas within which selected performance characteristics must occur.

Manufacturers of integrated circuits (IC's) must satisfy certain performance characteristics specified by users of the IC's who rely on the specifications to ensure proper operation of equipment incorporating the IC's. Typically, an IC user issues an engineering specification detailing the required operating characteristics and parameters for an integrated circuit. The engineering specification contains, for example maximum and minimum input and output voltages, output capacitance and maximum unpowered current leakage. Another significant performance characteristic usually specified by the IC user is the slew rate or rate of change of output signals generated by an integrated circuit.

While the IC specification method of the present invention is generally applicable for any integrated circuits, it will be described with reference to a transmitter driver for a data bus for which the method was developed and has been successfully performed. The transmitter driver provides controlled slew rate drive for a data bus of a data communications system. The noted transmitter driver was developed for use in motor vehicle multiplex communications systems which intercouple various accessories, accessory switches, sensors, displays and the like over data buses to reduce the physical wiring within a motor vehicle.

The signal transition characteristics of the transmitter driver including the signal slew rate must satisfy conflicting demands and become increasingly critical at higher data transmission rates. Thus, the transmitter driver must operate at a speed sufficient to allow maximum data transfer rates while minimizing induced electromagnetic interference (EMI) on the data bus. Excessive EMI on the data bus may result in unexpected vehicle faults causing unpredictable failures. Further, operation of other system components which are designed around a particular data transmission rate may be effected by deviations from the transmitter driver specification.

To prevent such problems, the IC manufacturer is provided with a detailed listing of the required transition characteristics of the transmitter driver. In order to meet the specifications for an integrated circuit, the IC manufacturer must normally test each individual performance characteristic specified to ensure compliance. Such testing requires substantial amounts of time and hence increases the cost of the IC. Further, meeting each individual performance specification can add to the cost of the IC since actions taken to meet one specification may detract from another specification which also must be met.

It is thus apparent that a need exists for an improved method of specifying the performance characteristics of an integrated circuit which reduces manufacturing and testing costs yet ensures proper operation of resulting integrated circuits.

SUMMARY OF THE INVENTION

This need is met by a method in accordance with the present invention for specifying characteristics of an integrated circuit wherein complementary output signals of the integrated circuit are required to cross one another within a signal transition box during transitions of the complementary output signals. The signal transition box is defined by a maximum output signal level as a high side, a minimum output signal level as a low side, a minimum delay time as a leading side and a maximum delay time as a trailing side. Preferably, a maximum allowable slew rate is also defined for transitions of the complementary output signals.

In accordance with one aspect of the present invention, a method for specifying the characteristics of an integrated circuit comprises the steps of: defining a maximum signal level as a high side of the signal transition box; defining a minimum signal level as a low side of the signal transition box; defining a minimum delay time for transitions of the output signals, the minimum delay time defining a leading side of the signal transition box; defining a maximum delay time for transitions of the output signals, the maximum delay time defining a trailing side of the signal transition box; and, requiring complementary ones of the two or more output signals to cross one another within the signal transition box during transitions of the complementary output signals.

In the illustrated embodiment, the integrated circuit is shown as a transmitter driver. The integrated circuit may have two or more input terminals and two or more output terminals.

Preferably, the method for specifying characteristics of an integrated circuit further comprises the step of defining a maximum allowable slew rate for transitions of the output signals.

It is thus a feature of the present invention to provide an improved method for specifying an integrated circuit by means of defining acceptable boundary areas within which selected performance characteristics must occur, such as transitions of complementary output signals.

Other features and advantages of the invention will be apparent from the following description, the accompanying drawings and the appended claims.

BRIEF DESCRIPTION OF THE DRAWINGS

FIG. 1 is a schematic block diagram of a portion of a motor vehicle multiplex communications system wherein the method of specifying an integrated circuit of the present invention may be advantageously utilized; and FIG. 2 is a signal transition timing diagram for an integrated circuit illustrating the method of the present invention.

DETAILED DESCRIPTION OF THE INVENTION

Reference is now made to the schematic block diagram of FIG. 1 which illustrates a portion of a motor vehicle multiplex communications system 100 as an example of a system wherein the method of specifying the characteristics of an integrated circuit of the present invention may be advantageously utilized. Initially, the operation of the communication system 100 and, in particular, a transmitter driver 102 integrated circuit will briefly be described. Power for the communication system 100 is provided on a conductor 103. A communication node 104 of the system 100 includes a communication module 106 coupled via an I/O port 108 to an accessory switch 110. In response to actuation of the switch 110, communication module 106 generates appropriate control data and complementary control data which are conveyed to the transmitter driver 102 over conductors 112.

Transmitter driver 102 serially communicates the control data and the complementary control data over a data bus of the communication system 100. In FIG. 1, the data bus is shown as a twisted wire pair 114 consisting of bus lines 116 and 118. Each communication module coupled to the twisted wire pair 114 receives the data through conductors 120 and 122; however, only the module which recognizes its own address is activated and that module actuates the corresponding accessory in response to the instruction received.

Again referring to FIG. 1, the transmitter driver 102 is provided with input terminals INA and INB which receive complementary input signals from the communication module 106 over the conductors 112. Since the input signals are complementary, when the terminal INA is high, the terminal INB is low and when the terminal INA is low, the terminal INB is high. Transmitter driver 102 provides slew rate controlled drive to the bus line 116 via an output terminal OUTA and to the bus line 118 via an output terminal OUTB.

In the event the terminal INA is low, the transmitter driver 102 releases the bus line 116 which is then pulled high by a resistor 124 if no other node is keeping the bus line 116 low. When a low to high transition occurs on the terminal INA, the transmitter driver 102 pulls the bus line 116 low at a controlled slew rate. Conversely, when the terminal INB is high, the transmitter driver 102 releases the bus line 118 so that it can be pulled low by the resistor 126 as long as no other node is keeping the bus line 118 high. When a high to low transition occurs on the terminal INB, the transmitter driver 102 pulls the bus line 118 high at a controlled slew rate.

Thus, by controlling the state of the bus lines 116 and 118, the transmitter driver 102 provides slew rate controlled drive to the twisted wire pair 114. Since the structure and philosophy of the communication system 100 are not important to the present invention beyond illustrating a system wherein the present invention may be advantageously applied, further details of the system 100 will not be disclosed herein. Those desiring additional information regarding communication systems in motor vehicles are referred to commonly assigned U.S. Pat. No. 4,792,950 which issued to Volk et al and is incorporated herein by reference.

Reference is now made to the signal transition timing diagram of FIG. 2 which illustrates a signal transition box 200 in accordance with the present invention for specifying the characteristics of an integrated circuit. The waveforms making up the transition timing diagram of FIG. 2 are for the transmitter driver 102 integrated circuit which has two input terminals INA, INB receiving complementary input signals S1 and S2 and two output terminals OUTA, OUTB providing complementary output signals S3 and S4. Input signals S1 and S2 are shown as being oppositely driven between a maximum signal crossing voltage VCC representing a logic high level and a minimum signal crossing voltage GND representing a logic low level. Similarly, output signals S3 and S4 are oppositely driven between VCC and GND.

The transition timing of the output signals S3 and S4 is measured from the point where the input signals S1 and S2 are equal during a transition, shown as a dashed line 202. In specifying the characteristics of an integrated circuit, a critical parameter is the passive-to-active transition timing of the output signals S3 and S4 in response to a transition of the input signals S1 and S2. In this regard, the present invention provides a method of specifying the transition timing of an integrated circuit by requiring the output signals S3 and S4 to cross or become equal to one another in the signal transition box 200 during a passive-to-active transition.

The signal transition box 200 has a leading side 204 defined by a minimum signal crossing delay time 206 and a trailing side 208 defined by a maximum signal crossing delay time 210. Preferably, the minimum delay time 206 and the maximum delay time 210 are specified as one hundred eighty (180) nanoseconds and five hundred (500) nanoseconds, respectively, for the transmitter driver 102 of FIG. 1 when the data communications system 100 is operated at 41.667 kilobits per second.

The signal transition box 200 has a high side 212 defined by a maximum signal crossing voltage VMAX and a low side 216 defined by a minimum signal crossing voltage VMIN. By requiring the signals to cross at a voltage level below VMAX and above VMIN, adequate current balance between the two output signals S3 and S4 is ensured to maintain acceptable noise levels for the system 100. The maximum signal crossing voltage VMAX and minimum signal crossing voltage VMIN are preferably 65 and 35 percent of the maximum output voltage VCC, respectively, for the transmitter driver 102. However, it should be apparent that the maximum signal crossing voltage VMAX and the minimum signal crossing voltage VMIN may be defined as any reasonable percentages of the maximum output voltage VCC as required for a given integrated circuit.

By thus defining the signal transition box 200, the characteristics of an integrated circuit can be specified by requiring complementary output signals S3 and S4 to cross or be equal to one another within the signal transition box 200 during passive-to-active transitions of the output signals S3 and S4. Active-to-passive transitions of the output signals S3 and S4 are governed primarily by the capacitance of the communication system 100. Specifications of the active-to-passive transitions are well known in the art, form no part of the present invention and accordingly will not be discussed herein.

Specifying the passive-to-active response of an integrated circuit in accordance with the present invention results in an integrated circuit which is fully operable for example for operations in the noted multiplex data communication system while minimizing electromagnetic interference generation. Moreover, the integrated circuit can be manufactured and tested for compliance with the specifying method of the present invention at a reduced cost.

Having thus described the method for specifying the characteristics of an integrated circuit of the present invention in detail and by reference to preferred embodiments thereof, it will be apparent that modifications and variations are possible without departing from the scope of the invention defined in the appended claims.

What is claimed is:

1. A method for specifying characteristics of an integrated circuit having at least first and second output signals which transition between a logical one state and a logical zero state, at least one of said at least first and second output signals being a complement of at least another one of said at least first and second output signals, said method comprising the steps of:

- defining a maximum signal level as a high side of a signal transition box;
- defining a minimum signal level as a low side of said signal transition box;
- defining a minimum delay time for transition of an output signal from said minimum signal level to said maximum signal level and from said maximum signal level to said minimum signal level, said minimum delay time defining a leading side of said signal transition box;
- defining a maximum delay time for transition of an output signal from said minimum signal level to said maximum signal level and from said maximum signal level to said minimum signal level, said maximum delay time defining a trailing side of said signal transition box; and
- requiring complementary ones of said at least first and second output signals to cross one another within said signal transition box during transitions of said complementary ones of said at least first and second signals.

2. A method for specifying characteristics of an integrated circuit as claimed in claim 1 further comprising the step of defining a maximum allowable slew rate for said at least first and second signals during transitions of said complementary ones of said at least first and second signals.

3. A method for specifying characteristics of an integrated circuit, said integrated circuit having first and second output terminals and first and second input terminals, said first and second output terminals having complementary output signals thereon and said first and second input terminals having complementary input signals thereon, said output signals on said first and second output terminals being capable of transitions between a maximum output voltage and a minimum output voltage in response to a transition of said input signals on said first and second input terminals, said method comprising the steps of:

- determining a maximum signal crossing voltage as a percentage of said maximum output voltage of said output signals, said maximum signal crossing voltage defining a high side of a signal transition box;
- determining a minimum signal crossing voltage as a percentage of said maximum output voltage of said output signals, said minimum signal crossing voltage defining a low side of said signal transition box;
- defining a minimum signal crossing delay time subsequent to transitions of said input signals, said minimum signal crossing delay time defining a leading side of said signal transition box;
- defining a maximum signal crossing delay time subsequent to transitions of said input signals, said maximum signal crossing delay time defining a trailing side of said signal transition box; and
- requiring said output signals to equal one another within said signal transition box as said output signals transition from said maximum output voltage to said minimum output voltage and from said minimum output voltage to said maximum output voltage.

4. A method for specifying characteristics of an integrated circuit as claimed in claim 3 further comprising the step of defining a maximum allowable slew rate for said output signals during transitions of said output signals.

5. A method for specifying characteristics of a transmitter driver having first and second input terminals and first and second output terminals, input signals on said first and second input terminals being complements of one another and output signals on said first and second output terminals being complements of one another, said first and second output signals being capable of transitions between a maximum output voltage and a minimum output voltage in response to transitions of said first and second input signals, said method comprising the steps of:

- determining a maximum signal crossing voltage equal to sixty five percent of said maximum output voltage, said maximum signal crossing voltage defining a high side of a signal transition box;
- determining a minimum signal crossing voltage equal to thirty five percent of said maximum output voltage, said minimum signal crossing voltage defining a low side of said signal transition box;
- defining a minimum signal crossing delay time subsequent to transitions of said input signals, said minimum signal crossing delay time being equal to one hundred and eighty (180) nanoseconds and defining a leading side of said signal transition box;
- defining a maximum signal crossing delay time subsequent to transitions of said input signals, said maximum signal crossing delay time being equal to five hundred (500) nanoseconds and defining a trailing side of said signal transition box; and
- requiring said output signals to cross one another within said signal transition box during transitions of said output signals.

* * * * *